United States Patent [19]
Parriaux et al.

[11] Patent Number: 5,331,272
[45] Date of Patent: Jul. 19, 1994

[54] OPTICAL SENSOR FOR DETECTING AN ELECTRIC FIELD VIA THE PARADAY EFFECT

[75] Inventors: Olivier Parriaux, Lausanne; Patrick DeBergh, Cressier; Jean-Pascal Chavanne, Bienne, all of Switzerland

[73] Assignee: Centre Suisse D'Electronique et de Microtechnique SA, Switzerland

[21] Appl. No.: 859,858

[22] Filed: Mar. 30, 1992

[30] Foreign Application Priority Data

Apr. 4, 1991 [CH] Switzerland .................. 00999/91

[51] Int. Cl.$^5$ ......................................... G01R 31/00
[52] U.S. Cl. ................................. 324/96; 324/117 R
[58] Field of Search .................. 256/227.21, 227.23, 256/227.17, 231.1; 356/365, 368; 385/12, 13, 15; 324/117 R, 96, 244.1; 359/265; 332/7.1

[56] References Cited

U.S. PATENT DOCUMENTS

| | | | |
|---|---|---|---|
| 3,649,931 | 3/1972 | Macek | 324/244.1 |
| 4,173,412 | 11/1979 | Ramsay et al. | 250/227.17 |
| 4,370,612 | 1/1983 | Puech et al. | |
| 4,563,639 | 1/1986 | Langeac | |
| 4,797,607 | 1/1989 | Dupraz | 324/96 |
| 4,882,716 | 11/1989 | Lefevre et al. | 385/12 |
| 4,886,333 | 12/1989 | Hicks | 385/12 |
| 4,926,116 | 5/1990 | Tehira | 324/117 R |
| 4,939,447 | 7/1990 | Bohnert et al. | 324/96 |
| 4,947,107 | 8/1990 | Doerfler et al. | 324/244.1 |
| 5,062,153 | 10/1991 | Jurpin et al. | 385/15 |
| 5,111,525 | 5/1992 | Hartouni | 385/12 |
| 5,137,357 | 8/1992 | Ferrar et al. | 372/94 |
| 5,144,690 | 9/1992 | Domash | 385/12 |

FOREIGN PATENT DOCUMENTS

| | | |
|---|---|---|
| 0143583 | 6/1985 | European Pat. Off. |
| 2548278 | 5/1977 | Fed. Rep. of Germany |
| 59-27266 | 2/1984 | Japan |

OTHER PUBLICATIONS

*Electronics Letter*, "Current Sensing By Mode Coupling in Fibre, Via the Faraday Effect", Jan. 31, 1991, vol. 27, No. 3. by Chu et al.

Rashleight et al. "Magneto-optic current sensing with Birefringent Fibers", Appl. Phys. Lett., vol. 34, No. 11, Jun. 1, 1979.

Kuribara et al. "Characteristics of Twisted Single Mode Optical Fiber for Current Sensor"; Trans. Inst. Electron. and Carman. Eng. Jpn. part C (Japan) vol. J66C, No. 2-173-174, Feb. 1983.

Smith; "Polarization and Magnetooptic Properties of Single Mode Optical Fiber"; Applied Optics, vol. 17, No. 1; Jan. 1, 1978.

Smith; "Optical Fibers for current Measurement Applications"; Optics and Laser Technology; Feb. 1980.

Yariv, "Coupled Mode Theory For Guided Wave Optics"; IEEE Journal of Quantum Electronics, vol. QE-9, No. 9, Sep. 1973.

Rarleigh; "Origins and Control of Polarization Effects in Single Mode Fibers"; Journal of lightwave Technology; vol. LT-1, No. 2; Jun. 1983.

Gortyeh et al.; "Fabrication of Polar Optical Waveguides" by K+ *ion Exchange in BK7 glass*; Optics Letters, vol. 11, No. 2, Feb. 1986.

*Primary Examiner*—Vinh Nguyen
*Attorney, Agent, or Firm*—Parkhurst, Wendel & Rossi

[57] ABSTRACT

The optical electric current sensor is composed of a birefringent light guide (2) coiled around an electric current conductor (1) and is characterized by a spatial modulation of the magnetic field or of the birefringence of the light guide, along the light guide, at a spatial period equal to a whole number of times the beat length of the guide.

7 Claims, 2 Drawing Sheets

OPTICAL SENSOR FOR DETECTING AN ELECTRIC FIELD VIA THE FARADAY EFFECT

BACKGROUND OF THE INVENTION

The present invention relates to light guide sensors and, more particularly, an optical electric current sensor.

Prior Faraday effect electric current sensors use single-mode fibers. These fibers must maintain the linear character of the wave polarization, therefore resulting in the desirability to use an optical fiber which is non-birefringent or has very low birefringence.

An out-of-round fiber core, sometimes due to uneven stresses accumulated during cooling when the fiber was drawn, is characterized by the introduction of intrinsic birefringence in the optic fiber.

Further, the fiber, being wound around the electric current conductor imparts an additional birefringence source, known as curvature birefringence.

These two linear birefringences have the major disadvantages of masking and interfering with the sought-for Faraday effect. This effect appears in a non-birefringent medium and under the effect of a magnetic field line collinear with the direction of propagation of the light wave, through the rotation of the polarization vector. The magnetic field line can originate from the circular magnetic field produced by the electric current in the conductor.

A solution proposed by S. C. Rashleigh and R. Ulrich in the article "MAGNETO-OPTIC CURRENT SENSING WITH BIREFRINGENT FIBERS", published in Applied Physic Letters, Vol. 34, No. 11, pp. 768 to 770 (1979), is the elimination of the perturbations due to the linear birefringences. In other words, it is a case of eliminating the linearly birefringent character of the optical waveguide, or dominating it by means of a strong circular birefringence. The article shows the use of a twisted fiber. In such a fiber, the circular birefringence introduced makes it possible to decrease the influence of the linear birefringence of curvature and to use a fiber with a long length.

A second solution is proposed by L Li et al. in the article "CURRENT SENSORS USING HIGHLY BIREFRINGENT BOWTIE FIBERS", published in Electronics Letters (1986), Vol. 22, No. 21, pp. 1142–1144. L Li et al. show that the effects of the presence of the internal and external linear birefringence can be controlled by using an optical fiber whose elliptical birefringence is high. Such a light guide is obtained by twisting, during its drawing, a fiber with high linear birefringence.

In such systems, the value of the electric current is deduced from the measurement of the rotation of the polarization plane.

Other solutions based on the same principle are described, for example, in the publications of:

M. Kuribara et al. "CHARACTERISTICS OF TWISTED SINGLE-MODE OPTICAL FIBER FOR CURRENT SENSOR", Transl. Inst. Electron. and Commun. Engl. Jpn. Part C (Japan), Vol. J66C, No. 2, February 1973;

A. M. Smith "POLARIZATION AND MAGNETOOPTIC PROPERTIES OF SINGLE-MODE OPTICAL FIBER", Applied Optics, Vol. 17, No. 1, January 1978, or again "OPTICAL FIBERS FOR CURRENT MEASUREMENT APPLICATIONS", Optics and Laser Technology, February 1980, by the same author.

Although the theory of coupled modes is known and was set out in 1973 by A. Yariv in IEEE Journal of Quantum Electronics (September 1973, pp. 919–933), or more recently by Scott C. Rashleigh in the Journal of Lightwave Technology (Vol. LT-1, No. 2, June 1983, pp. 312–331), and although mode coupling structures and their characteristics have been known and used for a long time in various fields (the U.S. Pat. No. 3,891,302 granted in June 1975 and the patent application GB 2,125,572A filed in August 1982), the state of the art shows that the Faraday effect electric current sensors of the prior art us a single mode optical fiber and are based on the elimination or domination of the intrinsic linear birefringence and birefringence of curvature of the said optical fiber.

SUMMARY OF THE INVENTION

Thus one object of the invention is an optical electric current sensor based on a principle of not seeking to eliminate the linearly birefringent character of the optical waveguide, nor to dominate it by means of a high circular or elliptical birefringence.

Another object of the invention is an optical electric current sensor not subject to the intrinsic linear birefringence and the linear birefringence of curvature and their fluctuation.

The optical electric current sensor of the present invention consists of emitter means, transmitter means disposed around an electric current conductor and receiver means, and is characterized by transducer means generating a spatial modulation of the magnetic field or of the birefringence of the transmitter means along the transmitter means, at a spatial period equal to a whole number of times the beat length $L_B$ of the transmitter means. The beat length $L_B$ of the transmitter means is the minimum propagation length along the waveguide after which the two polarization modes have accumulated a phase shift of $2\pi$.

One advantage of the invention lies in the use of the curvature of the light guide around the electric current conductor, to generate the periodicity of the coupling. The linear birefringence of curvature originating from the curvature of the guide therefore no longer needs to be eliminated or dominated.

Another advantage of such a configuration of the sensor is its low sensitivity to vibrations.

An advantage of the modulation of the birefringence of the light guide according to the invention is the possible use of a technology of integration on a flat substrate by the photolithographic transfer of masks.

BRIEF DESCRIPTION OF THE DRAWINGS

Other objects, characteristics and advantages of the present invention will be apparent from a reading of the following description, with reference to the accompanying drawings. These drawings show an electric current sensor, with a light guide, in which.

DETAILED DESCRIPTION OF THE PREFERRED EMBODIMENTS

In a general fashion, the optical electric current sensor of the invention consists of emitter means, transmitter means, transducer means and receiver means.

The transducer means are more particularly the subject of the present description, a description in which similar components bear the same references. For all embodiments coming within the scope of the present invention, the spatial period which is mentioned throughout the description is equal to a whole number times the beat length of the light guide.

Figure 1:
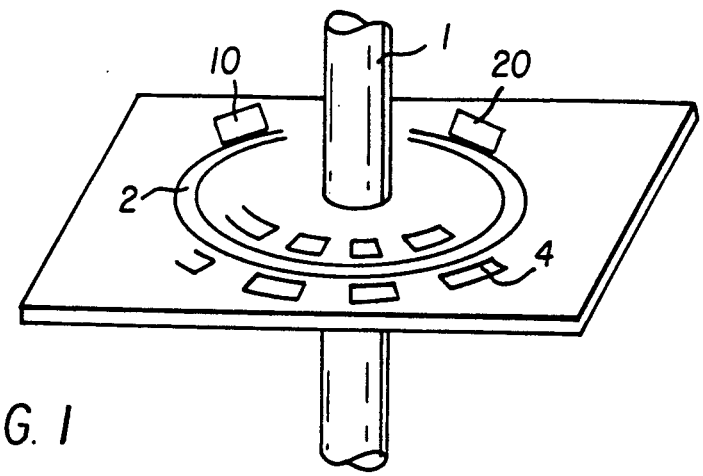
FIG. 1 depicts the magnetic field spatially modulated by the presence of magnetic areas.

FIG. 1 shows an electric current sensor including a birefringent light guide 2 coiled around an electric current conductor 1. The optical structure thus produced consists of one or more turns. A magnetic material, creating areas 4 where the magnetic field is concentrated, is distributed periodically along the core of the guide, at a spatial period equal to a whole number times the beat length $L_B$ of the light guide.

Figure 2:
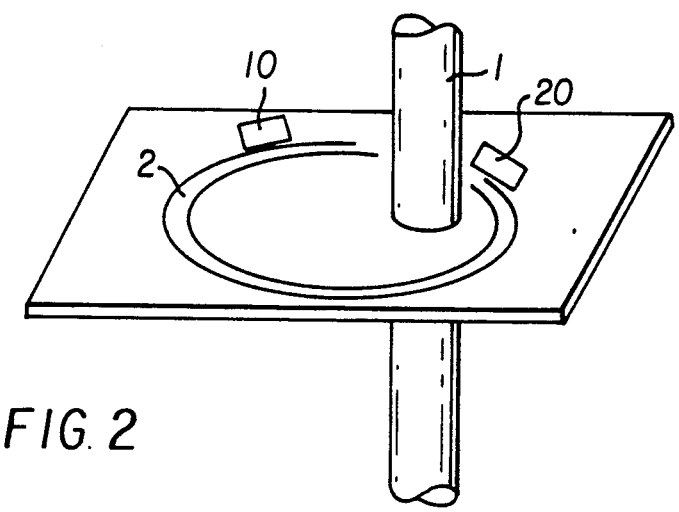
FIG. 2 depicts the magnetic field spatially modulated since the axis of the electric current conductor and the central axis normal to the optical coil are offset.

FIG. 2 shows an electric current sensor having the optical structure described above. The electric current sensor and the axis of the said optical structure are offset. In addition, the perimeter of each turn of the light guide 2 is equal to a whole number times the beat length $L_B$ of the guide.

Figure 3:
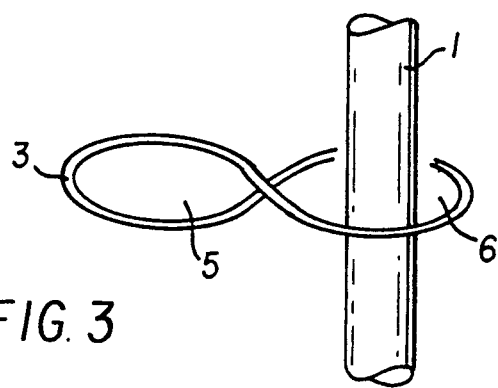
FIG. 3 depicts the sensor using a low-birefringence optical fiber in a double-loop configuration.

FIG. 3 shows an electric current sensor using an optical fiber 3 in a double-loop configuration defining loops 5, 6. The optical fiber is wound around an electric current conductor 1, to form one or more superimposed figure-eights, only one of the loops, loop 6, of each figure-eight having the conductor passing through it. The optical waveguide is, advantageously, an optical fiber having a very low intrinsic birefringence and having no more than one linear birefringence of curvature. In this case, the perimeter of each loop is equal to the half beat length of the coiled optical fiber.

FIG. 4 shows an electric current sensor having the above optical structure. The spatial modulation of the coupling coefficient K along the light guide is obtained in accordance with several possible embodiments.

Figure 4A:
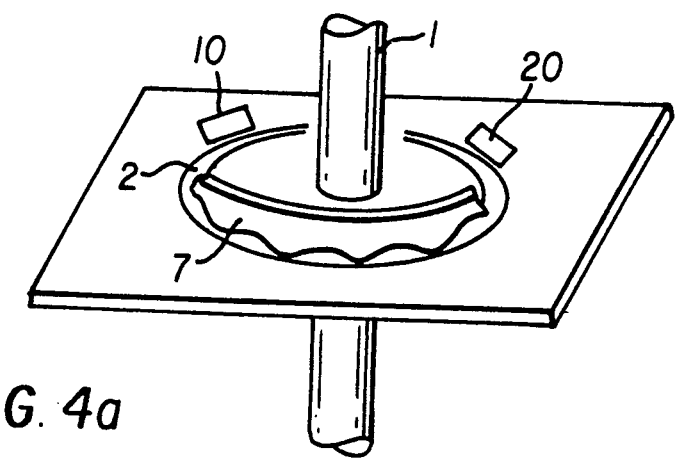
FIG. 4 depicts the birefringence of the light guide spatially modulated by applying:
- a periodic external force normal to the surface of the guide (FIG. 4a), or
- a periodic internal stress along the guide (FIG. 4b), or
- a periodic external stress along the guide (FIG. 4c).

The first embodiment is shown in FIG. 4a, in which an external force distributed periodically is applied to the light guide 2. The external force is applied by means of two devices 7 capable of introducing micro-curvatures in the light guide, for the purpose of obtaining a variation in the birefringence of the guide by photoelastic effect. The micro-curvatures have a spatial period equal to a whole number times the beat length $L_B$ of the said stressed guide.

Figure 4B:
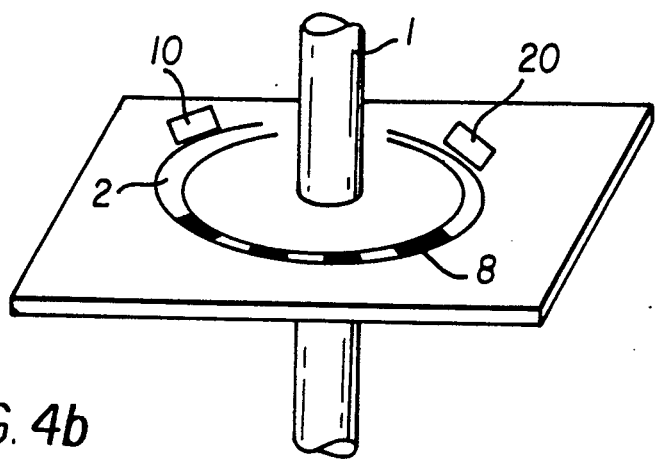

A second embodiment is shown in FIG. 4b, in which stress areas internal to the light guide 2 are produced periodically along its length. These periodic internal stresses 8 have a spatial period equal to the beat length $L_B$ of the said stressed guide.

Figure 4C:
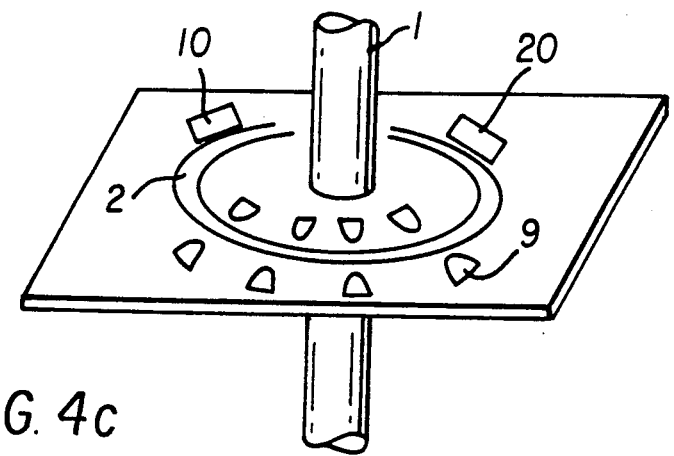

A third embodiment is shown in FIG. 4c, in which stress areas external to the light guide 2 are produced periodically along the latter. These periodic external stresses 9 have a spatial period equal to the beat length $L_B$ of the said stressed guide.

Another embodiment enabling the birefringence of the light guide to be modulated consists of a spacial modulation or periodic variances, with a period equal to the beat length of the stressed guide, of the cross section of the said guide.

The electric current sensor of the invention is shown in FIGS. 1 to 4, which illustrates two principles of functioning.

The first principle of functioning is based on obtaining of a coupling between polarization modes, due to a periodic spatial modulation of the magnetic field along the light guide, with a period equal to the beat length $L_B$ of the guide (FIGS. 1 to 3).

The second principle of functioning is based on obtaining of a coupling between polarization modes, due to a period spatial modulation of the birefringence of the light guide, with a period equal to the beat length $L_B$ of the said stressed guide (FIG. 4).

The formalism associated with the coupled mode theory is expressed by A. Yariv and S. C. Rashleigh in the articles cited above. This formalism applies to the phenomena of the propagation and interaction of the optical waves in a dielectric waveguide. The authors explain that, in the presence of perturbations, the light wave propagating in a light guide is transmitted from one mode to another. The perturbations are, for example, a periodic electrical field, a sound wave or a surface undulation.

With the electric current sensor according to the invention, the coupling between the two orthogonal polarization modes is dependent;
- on the one hand, on the coefficient K of coupling between the modes, which is not zero where a physical coupling effect exists, and
- on the other hand, in the case of a birefringent waveguide, on a synchronism between the two waves expressed by equality between the phased velocities of each wave.

The coupling coefficient K is given by the expression $K = 2\,VH$ in which V is the Verdet's constant of the material in which the light propagates and H is the magnetic field generated by the current I to be measured.

The physical coupling effect for which the coupling coefficient is not zero is in this case procured by the Faraday effect. The restoration of the synchronism between the two waves is caused by introducing a periodic spatial perturbation along the birefringent guide—namely a modulation of the magnetic field B or of the birefringence $\Delta$ of the guide—at a period equal to the beat length $L_B$ of the guide.

The modulation of the magnetic field or of the birefringence corresponds in fact to a modulation of the coefficient K of coupling between the polarization modes. The effect of a modulation of the coupling coefficient K along the said guide, at a spatial period equal to the beat length $L_B$, is characterized by an accumulation rather than a compensation for the constituent contributions of each period to the overall coupling sought for. In fact, mode coupling, referred to as outward coupling, corresponds to each positive half wave, and an inverse mode coupling, referred to as return coupling, corresponds to each negative half wave. Because of the modulation of the coupling coefficient, the return coupling at each half period is therefore either zero, or low, whence an overall non-zero coupling effect on each period.

In a preferred embodiment of the electric current sensor, the emitter means 10 is defined by a laser diode associated with a linear polarizer. The transmitter means is, for example, a birefringent single-mode light guide into which a previously selected polarization mode is introduced. The receiver means 20 is, for example, a polarization separator device associated with two optical detectors. The two orthogonal polarization modes at the light guide output are separated and then detected by the two optical detectors. The measurement of the light intensities of each polarization mode gives information about the coupling between modes and therefore about the value of the electric current which induced this Faraday effect coupling.

A preferred embodiment of the transducer means a shown in FIG. 1 can use an optical guide integrated on a passive substrate, for example on a silicon wafer. The technology of ion exchanges in glass, described by J. E. Gortych et al., "FABRICATION OF PLANAR OPTICAL WAVEGUIDES BY K+ ION EXCHANGE IN BK7 GLASS", Optics Letters, Vol. 11, No. 2, February 1986, pp. 100–102, can be used. In addition, a layer of magnetic material is deposited, for example on the integrated optical guide. One possible technology is the depositing of a material such as a ferrite or mu-metal by photolithography. The layer of magnetic material can also, and preferentially, be deposited on each side of the integrated optical guide, for example in the cavities provided in the substrate. The cavities may have various shapes, for example rectangular, so that the magnetic field is concentrated in these cavities.

A preferred embodiment of the transducer means as shown in FIG. 2 uses, for example, an integrated optical guide as cited previously. The turns of the integrated optical guide are not necessarily circular. The electric current conductor and the axis of the optical structure are offset, for example by 90% of the radius of a turn.

A preferred embodiment of the transducer means as shown in FIG. 3 uses a low-birefringence optical fiber forming one or more superimposed figure-eights. A preferential solution is the use of a single-mode optical fiber with a jacketed tablet with an external diameter of 250 μm, which allows a winding diameter of 40 mm. The period of modulation of the magnetic field is then precisely equal to the beat length.

A preferred embodiment of the transducer means as shown in FIGS. 4a to 4c uses, for example, an integrated optical guide as cited previously.

H. J. Shaw et al. describe, in their patent application EP 0143583, a device generating microcurvatures along an optical fiber. Such a device can easily be transposed to the electrical current sensor of the invention in accordance with the first embodiment (FIG. 4a).

A light guide having periodic internal stresses in accordance with the second embodiment (FIG. 4b) of the current sensor is obtained by diffusion of two ion classes.

The stress areas external to the light guide described in the third embodiment (FIG. 4c) are obtained, for example, after ion diffusion.

In accordance with the coupled modes theory, the light guide which can be used in the electric current sensor of the invention can be either an integrated optical waveguide or an optical fiber with covering. These light guides propagate two orthogonal polarization modes.

We claim:

1. An optical electric current sensor comprising:
light emitter means for emitting light having a first polarization mode defined by plane polarized light;
light transmitter means for transmission of said light, said light transmitter means being looped around a rectilinear electric current conductor which produces a circular magnetic field having field lines which are substantially collinear with a propagation direction of said light, said transmitter means being integrated on a substrate, wherein said transmitter means imparts a second polarization mode to said light due to birefringence of said transmitter means;
transducer means for generating a spatial modulation of at least one of said magnetic field and said birefringence of the transmitter means, said spatial modulation defined by a plurality of modulations, wherein adjacent modulations are spaced apart a distance equal to a spatial period defined by a whole number multiplied by a beat length of said transmitter means, said spatial modulation creating a coupling between said first and second polarization modes; and
light receiver means for detecting intensities of said first and second polarization modes for determination of a value of current traveling through said electric current conductor.

2. The device of claim 1, wherein said transducer means comprises periodic variances in a cross section of said transmitter means, thereby producing said spatial modulation of said birefringence of said transmitter means.

3. The device of claim 1, wherein said transducer means comprises at least one external device for introduction of periodic external pressure areas on said transmitter means, thereby producing periodic microcurvatures in said transmitter means.

4. The device of claim 1, wherein said transducer means comprises periodic internal stress areas in said transmitter means, thereby producing said spatial modulation of said birefringence of said transmitter means.

5. The device of claim 1, wherein said transducer means comprises periodic external stress areas on said transmitter means, thereby producing said spatial modulation of said birefringence of said transmitter means.

6. An optical electric current sensor comprising:
light emitter means for emitting light having a first polarization mode defined by plane polarized light;
light transmitter means for transmission of said light, said light transmitter means being looped around a rectilinear electric current conductor which produces a circular magnetic field having field lines which are substantially collinear with a propagation direction of said light, said light transmitter means being integrated on a substrate, wherein said transmitter means imparts a second polarization mode to said light due to birefringence of said transmitter means;
transducer means for generating a spatial modulation of said magnetic field, said spatial modulation defined by a plurality of modulations, wherein adjacent modulations are spaced apart a distance equal to a spatial period defined by a whole number multiplied by a beat length of said transmitter means, said spatial modulation creating a coupling between said first and second polarization modes; and
light receiver means for detecting intensities of said first and second polarization modes for determination of a value of current traveling through said electric current conductor.

7. An optical electric current sensor comprising:

light emitter means for emitting light having a first polarization mode defined by plane polarized light;

light transmitter means for transmission of said light, said light transmitter means being looped around a rectilinear electric current conductor which produces a circular magnetic field having field lines which are substantially collinear with a propagation direction of said light, said light transmitter means being integrated on a substrate, wherein said transmitter means imparts a second polarization mode to said light due to birefringence of said transmitter means;

transducer means for generating a spatial modulation of said magnetic field, said spatial modulation defined by a plurality of modulations, wherein adjacent modulations are spaced apart a distance equal to a spatial period defined by a whole number multiplied by a beat length of said transmitter means, said spatial modulation creating a coupling between said first and second polarization modes, said transducer means comprising magnetic material areas integrated on said substrate and being spaced apart from each other along a loop of said light transmitter means to produce said spatial modulation of said magnetic field by creating areas of concentration of said magnetic field; and light receiver means for detecting intensities of said first and second polarization modes for determination of a value of current traveling through said electric current conductor.

* * * * *